(12) United States Patent
Shimura

(10) Patent No.: US 10,523,167 B2
(45) Date of Patent: Dec. 31, 2019

(54) VARIABLE ATTENUATION DEVICE, PHASE-SWITCHING VARIABLE ATTENUATION DEVICE, AND PHASE SHIFTER

(71) Applicant: FUJITSU LIMITED, Kawasaki-shi, Kanagawa (JP)

(72) Inventor: Toshihiro Shimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 145 days.

(21) Appl. No.: 15/725,814

(22) Filed: Oct. 5, 2017

(65) Prior Publication Data

US 2018/0131338 A1 May 10, 2018

(30) Foreign Application Priority Data

Nov. 7, 2016 (JP) ................................. 2016-217463

(51) Int. Cl.
| | | |
|---|---|---|
| H01P 1/18 | (2006.01) | |
| H03G 1/00 | (2006.01) | |
| G01R 31/02 | (2006.01) | |
| G01R 31/319 | (2006.01) | |
| H01P 1/15 | (2006.01) | |
| H01P 1/22 | (2006.01) | |
| H04L 27/22 | (2006.01) | |
| H03H 11/20 | (2006.01) | |

(Continued)

(52) U.S. Cl.
CPC ............ *H03G 1/007* (2013.01); *G01R 31/025* (2013.01); *G01R 31/31926* (2013.01); *H01P 1/15* (2013.01); *H01P 1/18* (2013.01); *H01P 1/22* (2013.01); *H03H 11/20* (2013.01); *H03H 11/245* (2013.01); *H04L 27/22* (2013.01); *H03G 1/0088* (2013.01); *H03G 2201/106* (2013.01); *H03H 7/20* (2013.01)

(58) Field of Classification Search
CPC .... H01P 1/18; H01P 1/22; H01P 1/227; H01P 1/15; H03H 11/20; H03H 11/24; H03H 11/245; H03H 7/20; H03G 2201/106
USPC .............................................. 333/81 R, 81 A
See application file for complete search history.

(56) References Cited

U.S. PATENT DOCUMENTS

2018/0337659 A1* 11/2018 Mu .......................... H03H 7/25

FOREIGN PATENT DOCUMENTS

| JP | 05-37318 | 2/1993 |
|---|---|---|
| JP | 2001-168668 | 6/2001 |
| JP | 2002-246802 | 8/2002 |

* cited by examiner

*Primary Examiner* — Stephen E. Jones
(74) *Attorney, Agent, or Firm* — Fujitsu Patent Center

(57) ABSTRACT

A variable attenuation device includes: a first variable attenuator configured to receive a first signal through a first input end, attenuate the first signal by an amount of attenuation according to a control voltage, and output the attenuated first signal through a first output end, the first signal being one of a pair of differential signals having a 180-degree phase difference; a second variable attenuator configured to receive a second signal through a second input end, attenuate the second signal by the amount of attenuation according to the control voltage, and output the attenuated second signal through a second output end, the second signal being the other one of the pair of differential signals; a first signal distributer configured to distribute the second signal to the first output end; and a second signal distributer configured to distribute the first signal to the second output end.

26 Claims, 15 Drawing Sheets

(51) Int. Cl.
*H03H 11/24* (2006.01)
*H03H 7/20* (2006.01)

VARIABLE ATTENUATION DEVICE, PHASE-SWITCHING VARIABLE ATTENUATION DEVICE, AND PHASE SHIFTER

CROSS-REFERENCE TO RELATED APPLICATION

This application is based upon and claims the benefit of priority of the prior Japanese Patent Application No. 2016-217463, filed on Nov. 7, 2016, the entire contents of which are incorporated herein by reference.

FIELD

The embodiments discussed herein are related to a variable attenuation device, a phase-switching variable attenuation device, and a phase shifter.

BACKGROUND

In recent years, phased array systems, which steer the direction of antenna beams of high frequency, such as the millimeter wave band, are used in fields of communications, sensors, and the like. Phased array systems employ phase shifters, for example. Phase shifters are desirably configured to shift the phase from 0 to 360 degrees while keeping the amplitude of the signal fixed.

Some related techniques are disclosed by Japanese Laid-open Patent Publication Nos. 2001-168668, 2002-246802, and 5-37318.

SUMMARY

According to an aspect of the embodiments, a variable attenuation device includes: a first variable attenuator configured to receive a first signal through a first input end, attenuate the first signal by an amount of attenuation according to a control voltage, and output the attenuated first signal through a first output end, the first signal being one of a pair of differential signals having a 180-degree phase difference; a second variable attenuator configured to receive a second signal through a second input end, attenuate the second signal by the amount of attenuation according to the control voltage, and output the attenuated second signal through a second output end, the second signal being the other one of the pair of differential signals; a first signal distributer configured to distribute the second signal to the first output end; and a second signal distributer configured to distribute the first signal to the second output end.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
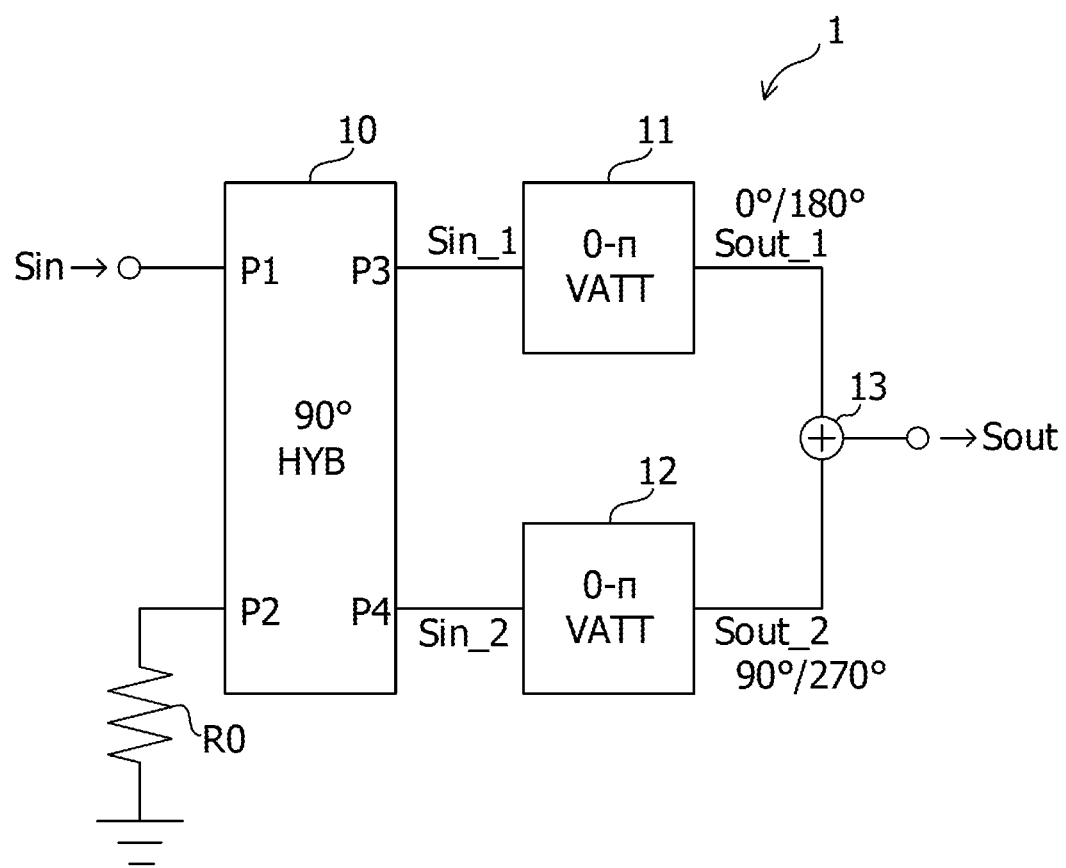
FIG. 1 illustrates an example of a phase shifter.
Figure 2A:
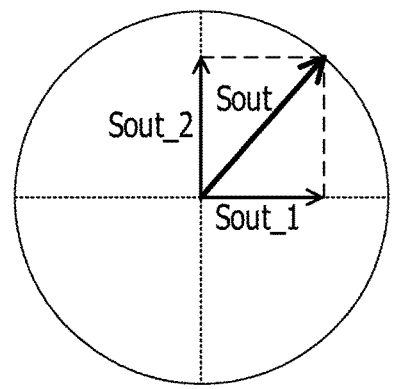
FIGS. 2A to 2D illustrate examples of phase vectors of output signals from the phase shifter.
Figure 2B:
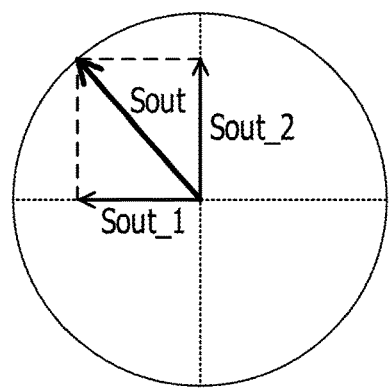
Figure 2C:
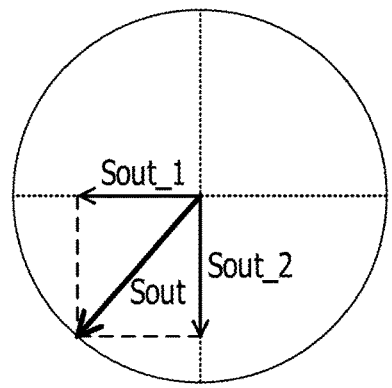
Figure 2D:
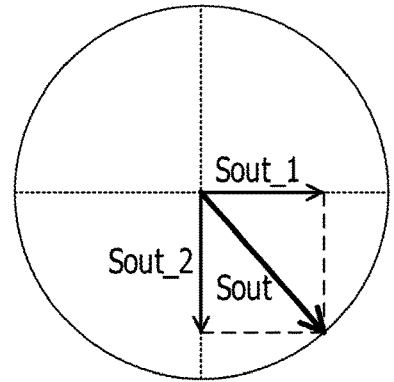

A phased array system employs a phase shifter, for example. The phase shifter is desirably configured to shift the phase of from 0 to 360 degrees while keeping the amplitude of the signal fixed.

As a technique concerning phase shifters, preferably, a 2π phase shifter which changes the phase of input signals from 0 to 2π rad may be provided. The 2π phase shifter includes a first distributor configured to distribute an input signal into a 0 rad phase signal and a π rad shifted signal. The 2π phase shifter further includes a second distributor configured to further distribute the 0 rad signal and the π rad shifted signal that are distributed by the first distributor, into two signals of a 0 rad signal and a π/2 rad shifted signal. The 2π phase shifter includes four variable attenuators which change the levels of the four signals distributed by the second distributor and a member to combine outputs from the four variable attenuators.

Attenuators used to control the signal amplitude in the phase shifter include a π-type variable attenuator which includes a field effect transistor (FET) and a resistive element.

For example, preferably, in a high-frequency switch configured to select one of plural high-frequency input signals as an output signal, isolation of the input signal on the "off" side of the high-frequency switch may be improved. The high-frequency switch includes a cancellation signal generator, which is provided for each of the plural high-frequency input signals. The cancellation signal generator generates a cancellation signal that has the same amplitude as a leakage signal leaking from the high-frequency input signal to the output signal side and has a phase opposite thereto. The high-frequency switch further includes an application circuit configured to apply to the output signal, the cancellation signal generated by the cancel signal generator.

The 2π phase shifter uses two-signal combiners arranged in two stages in order to combine the outputs from the four variable attenuators. The arrangement of the two-signal combiners in two stages may produce a large combining loss and reduce the power of the output signal, for example.

A π-type variable attenuator including an FET and a resistive element may have a problem of signal leakage when high-frequency signal is input. For example, a π-type variable attenuator that includes a passive circuit not requesting driving power, has a low isolation performance for high-frequency signal and may have difficulty implementing high attenuation. If such a variable attenuator of a low isolation performance for high-frequency signal is applied to a phase shifter, the phase shifter may have difficulty outputting signal having a particular phase, resulting in large phase error.

For example, preferably, a variable attenuation device which is applicable to a phase shifter and implements high attenuation may be provided.

In the following drawings, substantially identical or equivalent constituent components and portions are given the same reference numerals.

FIG. 1 illustrates an example of a phase shifter. A phase shifter 1 shifts the phase of an input signal Sin according to control voltage supplied externally and outputs the resultant signal as an output signal Sout. The phase shifter 1 may be a vector composition-type phase shifter which is able to continuously shift the phase of the output signal Sout within a range of 0 to 360 degrees while keeping the amplitude of the output signal Sout fixed. The phase shifter 1 includes a 90-degree hybrid 10, two phase-switching variable attenuation devices (hereinafter, referred to as 0-π VATT) 11 and 12, and a combining unit 13.

The 90-degree hybrid 10 splits the input signal Sin into two signals having identical amplitudes and a 90-degree phase difference. The 90-degree hybrid 10 includes first to fourth ports P1 to P4. The first port P1 receives the input signal Sin, and the second port P2 is connected to the ground line through a resistive element R0. The third port P3 outputs a first signal Sin_1 with a phase 90 degrees different from that of the input signal Sin, for example. The fourth port P4 outputs a second signal Sin_2 with a phase 180 degrees different from that of the input signal Sin, for example. The first and second signals Sin_1 and Sin_2 request to have a 90-degree phase difference, for example. The phase differences between the input signal Sin and the first and second signals Sin_1 and Sin_2 are not limited to the above-description. The first signal Sin_1 is input to the 0-π VATT 11, and the second signal Sin_2 is input to the 0-π VATT 12.

The 0-π VATT 11 attenuates the amplitude of the input first signal Sin_1 by an amount of attenuation corresponding to control voltage supplied externally and outputs the resultant signal as an output signal Sout_1. The 0-π VATT 11 switches the phase of the output signal Sout_1 so that the phase difference between the output signal Sout_1 and first signal Sin_1 is 0 or 180 degrees.

The function and configuration of the 0-π VATT 12 may be the substantially same or similar to those of the 0-π VATT 11. The 0-π VATT 12 attenuates the amplitude of the input second signal Sin_2 by an amount of attenuation corresponding to control voltage supplied externally and outputs the resultant signal as an output signal Sout_2. The 0-π VATT 12 switches the phase of the output signal Sout_2 so that the phase difference between the output signal Sout_2 and second signal Sin_2 is 0 or 180 degrees, for example or so that the phase difference between the output signal Sout_2 and first signal Sin_1 is 90 or 270 degrees, for example.

The combining unit 13 combines the output signal Sout_1 from the 0-π VATT 11 and the output signal Sout_2 from the 0-π VATT 12 in phase and outputs the resultant signal as the output signal Sout.

FIGS. 2A to 2D illustrate examples of phase vectors of output signals from the phase shifter. FIGS. 2A to 2D illustrate phase vectors of the output signal Sout generated by vector composition of the output signal Sout_1 from the 0-π VATT 11 and the output signal Sout_2 from the 0-π VATT 12. The 0-π VATTs 11 and 12 include a function of switching the phase of the output signals Sout_1 and Sout_2 by 180 degrees respectively, and a function of changing the amplitude thereof. In the output signal Sout, the phase is thereby shifted by 360 degrees while the amplitude is kept fixed.

Figure 3:
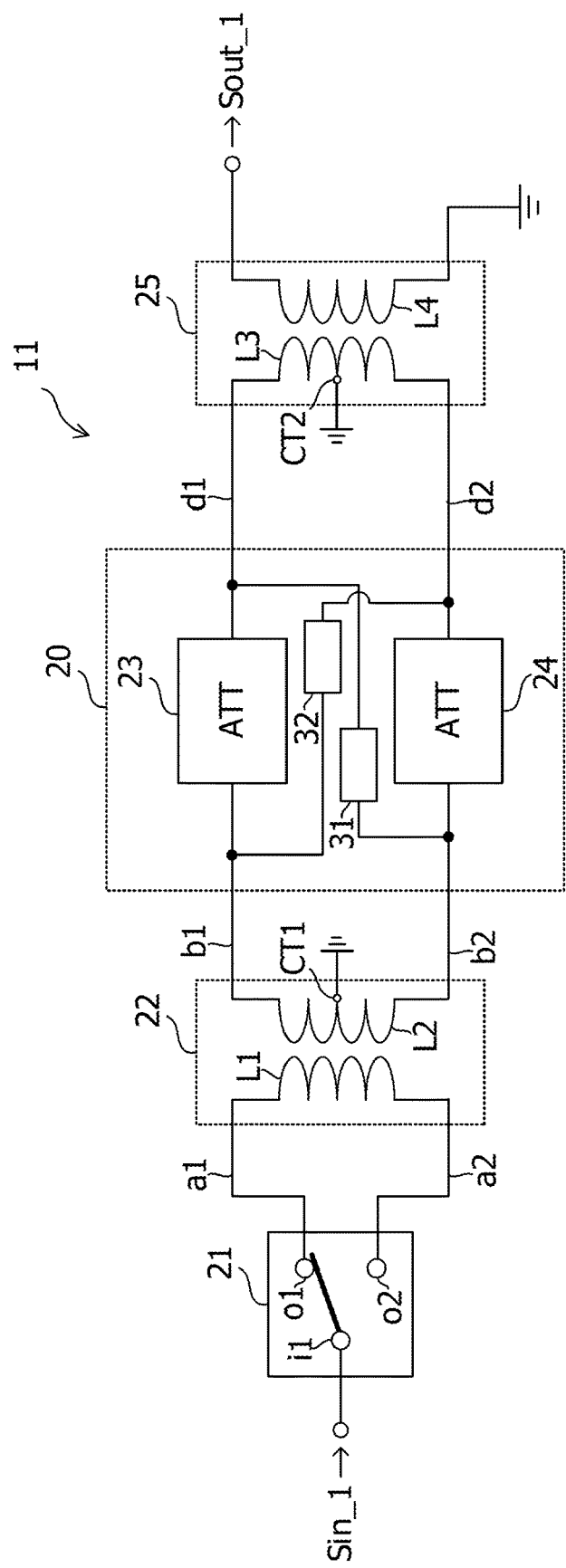
FIG. 3 illustrates an example of a phase-switching variable attenuation device.

FIG. 3 illustrates an example of a phase-switching variable attenuation device. FIG. 3 illustrates a configuration of the 0-π VATT 11. The configuration of the 0-π VATT 12 is the substantially same or similar to that of the 0-π VATT 11. The 0-π VATT 11 includes a switch unit 21, a transformer 22, a variable attenuation unit 20, and a transformer 25.

The switch unit 21 may function as a single pole, double throw (SPDT) switch including two output ends o1 and o2 for one input end i1. The input end i1 of the switch unit 21, which is the input end of the 0-π VATT 11, receives the first signal Sin_1 output from the 90-degree hybrid 10. The switch unit 21 outputs the first signal Sin_1 to one of the output ends o1 and o2. The first signal Sin_1 is input through a node a1 or a2 to the transformer 22 according to the switching operation of the switch unit 21.

The transformer 22 includes a primary coil L1 and a secondary coil L2. An end of the primary coil L1 is connected to the output end o1 of the switch unit 21 while the other end is connected to the output end o2 of the switch unit 21. An end of the secondary coil L2 is connected to the node b1 while the other end is connected to the node b2. The transformer 22 converts the first signal Sin_1, which is a single ended signal supplied through the switch unit 21, to a pair of differential signals having a 180-degree phase difference and outputs the differential signals to the nodes b1 and b2. For example, the phase of the signal appearing at the node b1 may be 180 degrees different from the phase of the signal appearing at the node b2. The transformer 22 inverts the phases of the pair of differential signals depending on the switching operation of the switch unit 21. The phase of the signal appearing at the node b1 when the switch unit 21 is connected to the node a1 side may be 180 degrees different from the phase of the signal appearing at the node b1 when the switching section 21 is connected to the node a2 side. The same may apply to the signal appearing at the node b2. A center tap CT1 of the secondary coil L2 of the transformer 22 may be fixed to the ground potential through a low-impedance circuit. Fixing the center tap CT1 of the secondary coil L2 to the ground potential may stabilize the differential signals at least in a desired frequency band. In FIG. 3, DC is fixed to the ground potential.

Figure 14:
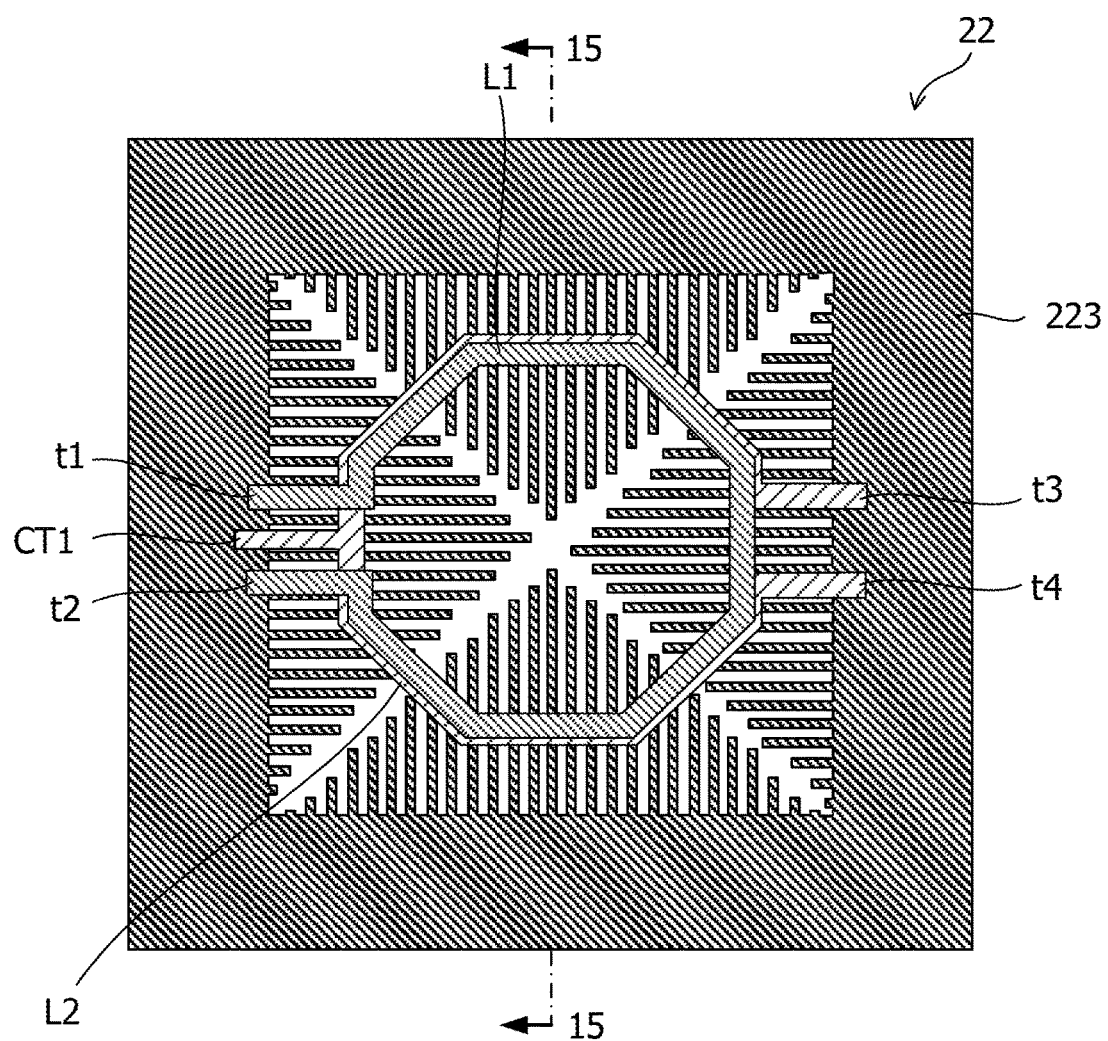
FIG. 14 illustrates an example of a plan view of a pattern layout of a transformer.
Figure 15:
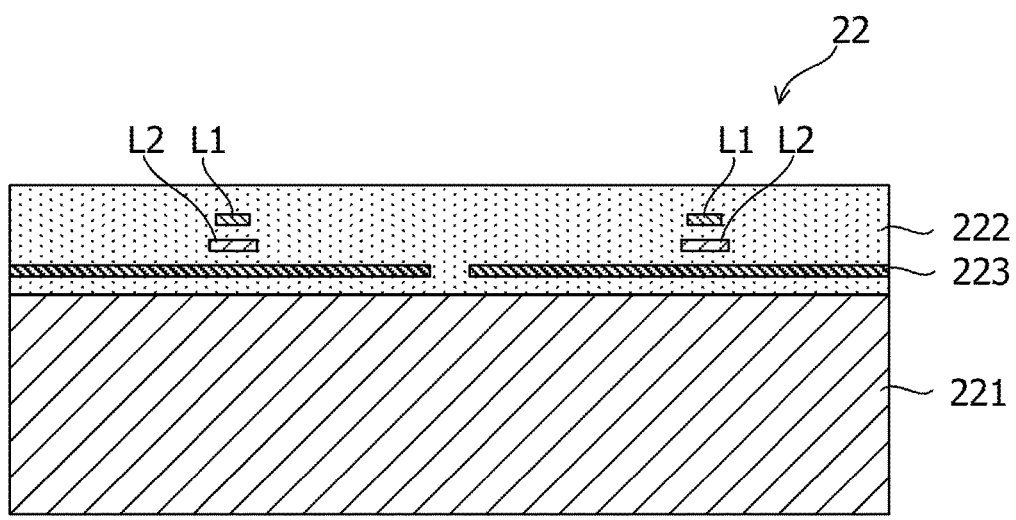
FIG. 15 illustrates an example of a cross-sectional view along a line XV-XV illustrated in FIG. 14.

FIG. 14 illustrates a plan view example of the pattern layout of the transformer. FIG. 15 illustrates an example of the cross-sectional view taken along line XV-XV illustrated in FIG. 14. The primary and secondary coils L1 and L2 and a ground metal 223, including the transformer 22, are provided in a metal layer provided on a silicon substrate 221. The primary and secondary coils L1 and L2 and the ground metal 223 are insulated from each other by a dielectric layer 222 provided on the silicon substrate 221. The primary coil L1 is provided in the metal layer above the secondary coil L2 and has a ring pattern. A terminal t1 of the primary coil L1 is connected to the output end o1 of the switch unit 21. A terminal t2 of the primary coil L1 is connected to the output end o2 of the switch unit 21. The secondary coil L2 has a ring pattern in a similar manner to the primary coil L1. A terminal t3 of the secondary coil L2 is connected to the node b1. A terminal t4 of the secondary coil L2 is connected to the node b2. The center tap CT1 of the secondary coil L2 is fixed to the ground potential. The ring patterns of the primary and secondary coils L1 and L2 may be located so as to overlap each other.

In a metal layer under the secondary coil L2, the ground metal 223 fixed to the ground potential is provided. The ground metal 223 is subjected to patterning so that metal is partially removed in a region right under the primary and secondary coils L1 and L2. If the region right under the primary and secondary coils L1 and L2 is filled with metal fixed to the ground potential, parasitic capacitors with an end fixed to the ground potential are added to the primary and secondary coils L1 and L2, which may degrade the characteristics. When all metal is removed from the region right under the primary and secondary coils L1 and L2, for example, the silicon substrate 221 working as a resistive component may have significant influence, producing a large loss. As illustrated in FIG. 14, for example, if the ground metal 223 includes a pattern of metal partially removed in the region right under the primary and secondary coils L1 and L2, the parasitic capacitors and silicon substrate 221 may have less influence, thus providing good characteristics. The pattern layout of the transformer 22 illustrated in FIG. 14 may provide good characteristics especially in processing of signals having frequencies in the millimeter wave band.

The variable attenuation unit 20 includes a first variable attenuation unit 23, a second variable attenuation unit 24, a first signal distribution unit 31, and a second signal distribution unit 32. The input end of the first variable attenuation unit 23 is connected to the node b1, and the output end thereof is connected to a node d1. The first variable attenuation unit 23 attenuates one of the pair of differential signals input to the input end by the amount of attenuation corresponding to control voltage supplied externally and outputs the resultant signal through the output end. The input end of the second variable attenuation unit 24 is connected to the node b2, and the output end thereof is connected to a node d2. The second variable attenuation unit 24 attenuates the other one of the pair of differential signals input to the input end by the amount of attenuation corresponding to control voltage supplied externally and outputs the resultant signal through the output end.

An end of the first signal distribution unit 31 is connected to the input end (node b2) of the second variable attenuation unit 24, and the other end thereof is connected to the output end (node d1) of the first variable attenuation unit 23. The first signal distribution unit 31 distributes the differential signal input to the input end (node b2) of the second variable attenuation unit 24 to the output end (node d1) of the first variable attenuation unit 23. An end of the second signal distribution unit 32 is connected to the input end (node b1) of the first variable attenuation unit 23, and the other end thereof is connected to the output end (node d2) of the second variable attenuation unit 24. The second signal distribution unit 32 distributes the differential signal input to the input end (node b1) of the first variable attenuation unit 23 to the output end (node d2) of the second variable attenuation unit 24.

The transformer 25 includes a primary coil L3 and a secondary coil L4. An end of the primary coil L3 is connected to the node d1, and the other end thereof is connected to the node d2. An end of the secondary coil L4 is connected to the output end of the 0-π VATT 11, and the other end thereof is connected to the ground potential. The transformer 25 converts the pair of differential signals supplied through the nodes d1 and d2 to a single ended signal and outputs the single ended signal as the output signal Sout_1 of the 0-π VATT 11. A center tap CT2 of the primary coil L3 of the transformer 25 may be fixed to the ground potential through a low-impedance circuit. Fixing the center tap CT2 of the primary coil L3 to the ground potential may stabilize the differential signals at least in a desired frequency band. In FIGS. 14 and 15, DC is also fixed to the ground potential.

According to the 0-π VATT 11, the attenuation effect of the variable attenuation unit 20 may vary the amplitude of the output signal Sout_1. According to the 0-π VATT 11, the phase of the output signal Sout_1 changes by 180 degrees according to the switching operation of the switch unit 21. For example, when the switch unit 21 selects the node a1 to supply the first signal Sin_1 to the transformer 22 through the node a1, the phase of the output signal Sout_1 is the same as that of the first signal Sin_1. For example, when the switch unit 21 selects the node a2 to supply the first signal Sin_1 to the transformer 22 through the node a2, the phase of the output signal Sout_1 is shifted by 180 degrees with respect to the phase of the first signal Sin-1.

Figure 4:
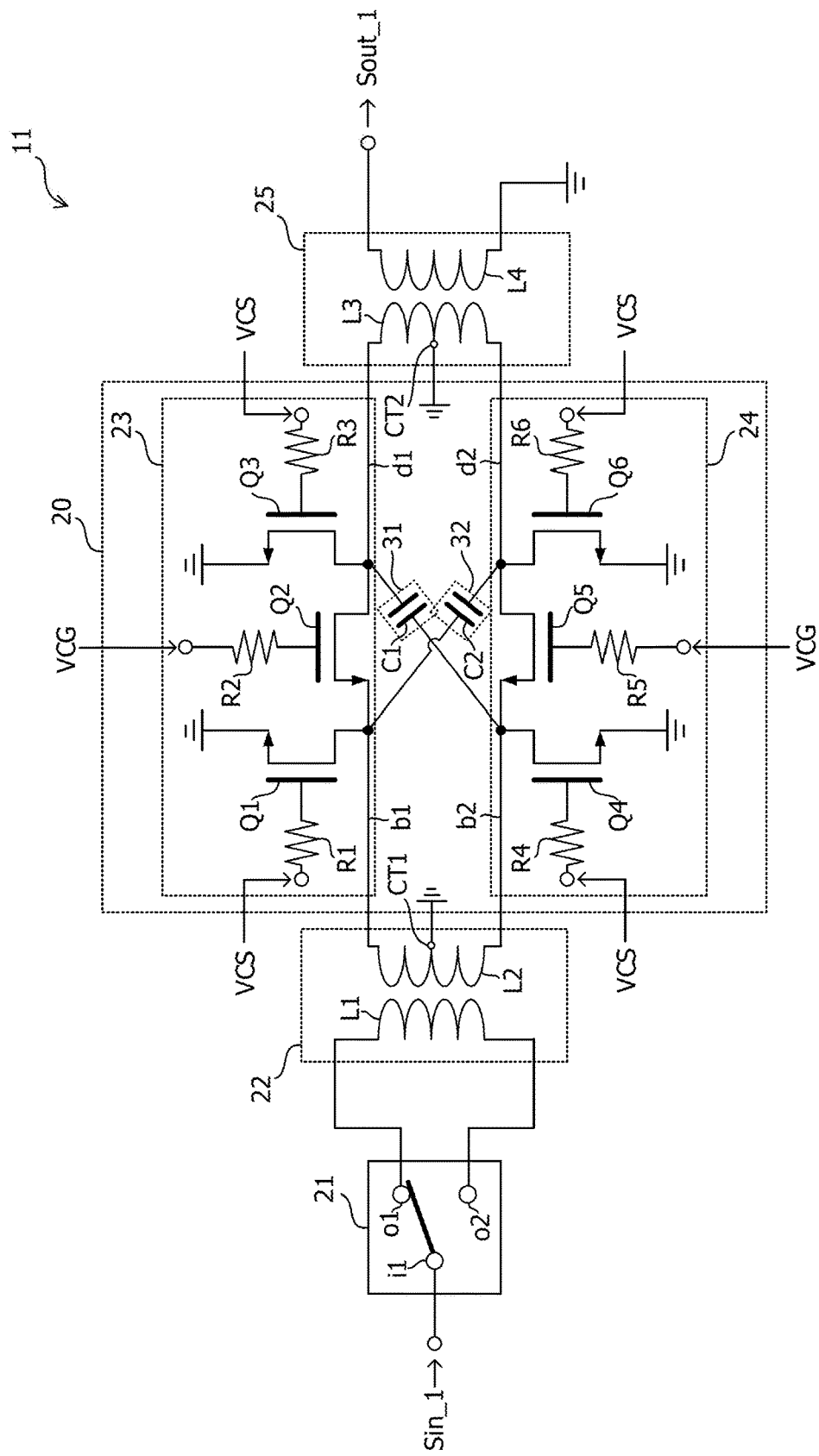
FIG. 4 illustrates an example of a variable attenuation unit.

FIG. 4 illustrates an example of the variable attenuation unit. The first variable attenuation unit 23 includes a π-type variable attenuator including n-channel transistors Q1, Q2, and Q3 and resistive elements R1, R2, and R3, which are connected to the gates of the transistors Q1, Q2, and Q3, respectively. In the transistor Q1, the drain is connected to the node b1, and the source is connected to the ground line. In the transistor Q2, the source is connected to the node b1, and the drain is connected to the node d1. In the transistor Q3, the drain is connected to the node d1, and the source is connected to the ground line. The transistors Q1, Q2, and Q3 may function as variable resistors varying in resistance according to control voltages VCS and VCG supplied to the gates. With the change in the resistances of the transistors Q1, Q2, and Q3, the amount of attenuation in the first variable attenuation unit 23 changes. In the first variable attenuation unit 23, the resistances of the transistors Q1, Q2, and Q3 may be determined so that the port impedance (characteristic impedance) is kept fixed even when the amount of attenuation is changed.

In the first variable attenuation unit 23, resistances $R_{Q1}$, $R_{Q2}$, and $R_{Q3}$ of the transistors Q1, Q2, and Q3 are set so as to satisfy Equations 1 to 3 below as an example. Herein, the amount of attenuation in the first variable attenuation unit 23 is A (dB), and the port impedance of the first variable attenuation unit 23 is $Z_0$ (Ω).

$$R_{Q2}=Z_0(1+k)/(1-k) \quad (1)$$

$$R_{Q1}=R_{Q3}=Z_0(1+k^2)/2k \quad (2)$$

$$k=10^{-A/20} \quad (3)$$

The second variable attenuation unit 24 may include the substantially same or similar configuration to that of the first variable attenuation unit 23. The second variable attenuation unit 24 includes a π-type variable attenuator including n-channel transistors Q4, Q5, and Q6 and resistive elements R4, R5, and R6 connected to the gates of the transistors Q4, Q5, and Q6, respectively. In the transistor Q4, the drain is connected to the node b2, and the source is connected to the ground line. In the transistor Q5, the source is connected to the node b2, and the drain is connected to the node d2. In the transistor Q6, the drain is connected to the node d2, and the source is connected to the ground line. The transistors Q4, Q5, and Q6 may function as variable resistors changing in resistance according to the control voltages VCS and VCG supplied to the gates. With the change in the resistances of the transistors Q4, Q5, and Q6, the amount of attenuation in the second variable attenuation unit 24 changes. In the second variable attenuation unit 24, the resistances of the transistors Q4, Q5, and Q6 may be determined so that the port impedance (characteristic impedance) is kept fixed even when the amount of attenuation is changed. The relationship between the resistances of the transistors Q4, Q5, and Q6 and the port impedance and the amount of attenuation in the second variable attenuation unit 24 may follow Equations 1 to 3 above.

The first signal distribution unit 31 includes a capacitor C1. An end of the capacitor C1 is connected to the input end (node b2) of the second variable attenuation unit 24, and the other end is connected to the output end of the first variable attenuation unit 23. The capacitance of the capacitor C1 may be substantially equal to the capacitance of the parasitic capacitor formed between the input end (node b1) and the output end (node d1) of the first variable attenuation unit 23. Similarly, the second signal distribution unit 32 includes a capacitor C2. An end of the capacitor C2 is connected to the input end (node b1) of the first variable attenuation unit 23, and the other end is connected to the output end (node d2) of the second variable attenuation unit 24. The capacitance of the capacitor C2 may be substantially equal to the capacitance of the parasitic capacitor formed between the input end (node b2) and the output end (node d2) of the second variable attenuation unit 24.

Figure 5:
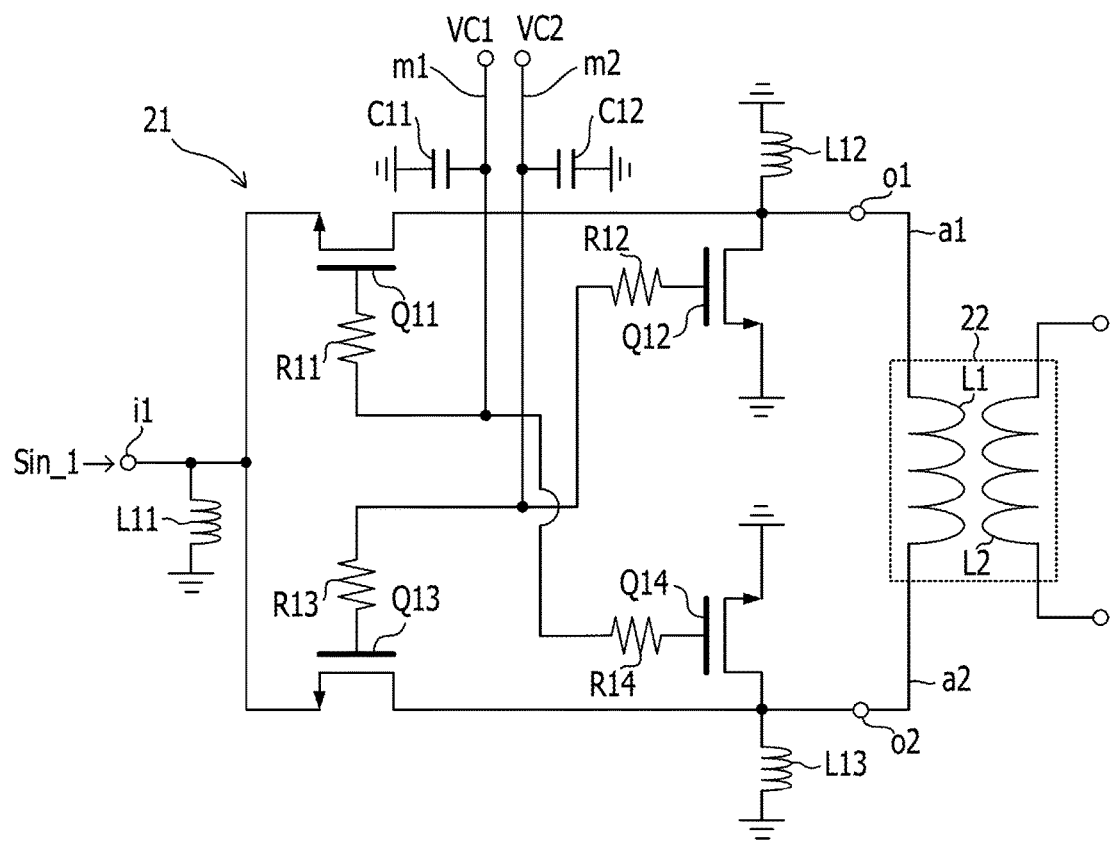
FIG. 5 illustrates an example of a switch unit.

FIG. 5 illustrates an example of the switch unit. The switch unit 21 includes n-channel transistors Q11 to Q14, resistive elements R11 to R14, inductors L11 to L13, and capacitors C11 and C12.

In the transistor Q11, the source is connected to the input end i1; the drain is connected to the output end o1; and the gate is connected to an end of the resistive element R11. In the transistor Q12, the drain is connected to the output end o1; the source is connected to the ground line; and the gate is connected to an end of the resistive element R12. In the transistor Q13, the source is connected to the input end i1; the drain is connected to the output end o2; and the gate is connected to an end of the resistive element R13. In the transistor Q14, the drain is connected to the output end o2; the source is connected to the ground line; and the gate is connected to an end of the resistive element R14. The other ends of the resistive elements R11 and R14 are connected to a line m1, and the other ends of the resistive elements R12 and R13 are connected to a line m2.

An end of the capacitor C11 is connected to the line m1 while the other end is connected to the ground line. An end of the capacitor C12 is connected to the line m2 while the other end is connected to the ground line. An end of the inductor L11 is connected to the input end i1 while the other end is connected to the ground line. An end of the inductor L12 is connected to the output end o1 while the other end is connected to the ground line. An end of the inductor L13 is connected to the output end o2 while the other end is connected to the ground line. The inductors L11 to L13 are used for impedance matching of the capacitance components of the transistors Q11 to Q14. The capacitors C11 and C12 are used to remove noise components mixed in the control voltages VC1 and VC2.

The line m1 is supplied with the control voltage VC1. The transistors Q11 and Q14 are simultaneously turned on or off according to the control voltage VC1. The line m2 is supplied with the control voltage VC2. The transistors Q12 and Q13 are simultaneously turned on or off according to the control voltage VC2. The control voltages VC1 and VC2 are complementary voltages. When the transistors Q11 and Q14 are turned on, for example, the transistors Q12 and Q13 are turned off. When the transistors Q11 and Q14 are turned off, for example, the transistors Q12 and Q13 are turned on.

Figure 6A:
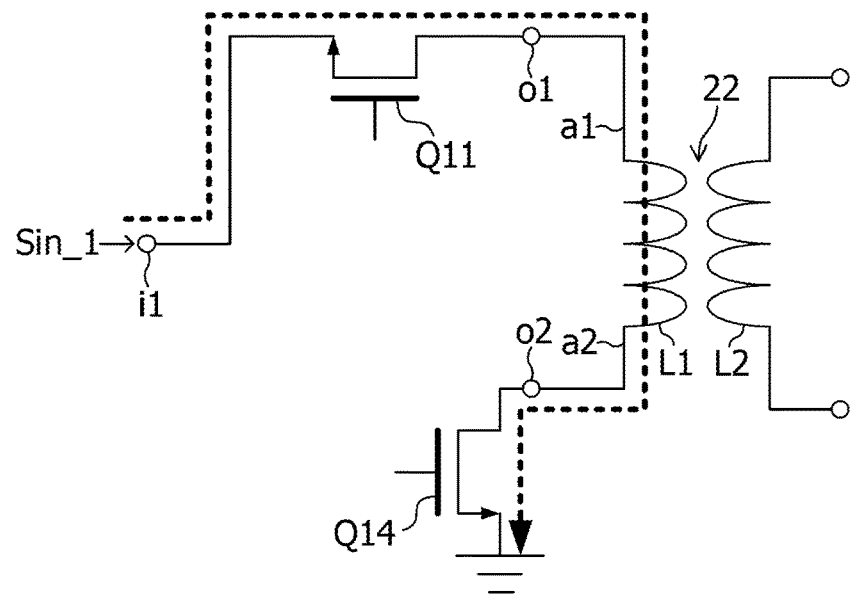
FIGS. 6A and 6B illustrate path examples of a first signal input to an input end of the switch unit.
Figure 6B:
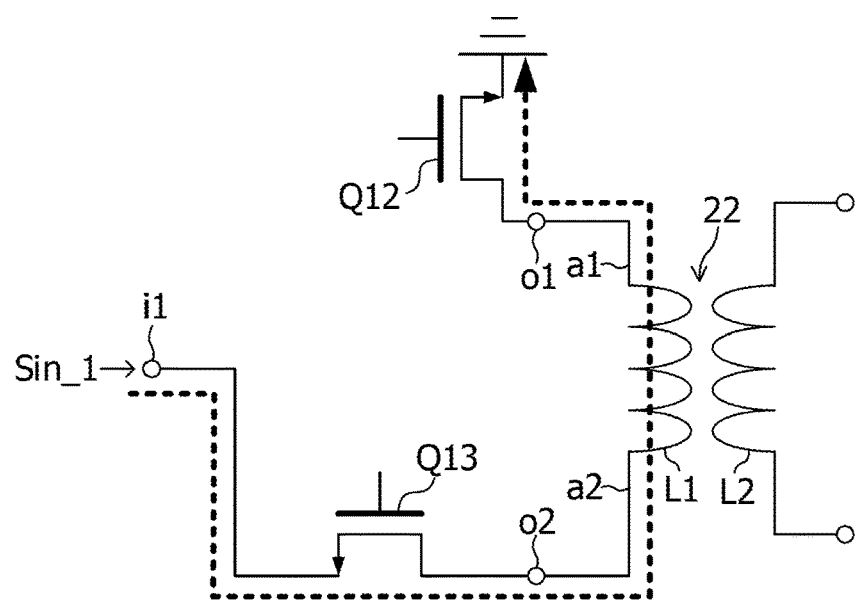

FIGS. 6A and 6B illustrate path examples of a first signal input to the input end of the switch unit. FIG. 6A illustrates the path of the first signal Sin_1 input to the input end i1 of the switch unit 21 when the transistors Q11 and Q14 of the switch unit 21 are turned on while the transistors Q12 and Q13 are turned off. When the transistors Q11 and Q14 are turned on, the first signal Sin_1 is supplied through the node a1 to the primary coil L1 of the transformer 22, and the end of the primary coil L1 on the node a2 side is short-circuited to the ground line.

FIG. 6B illustrates the path of the first signal Sin_1 input to the input end i1 of the switch unit 21 when the transistors Q12 and Q13 of the switch unit 21 are turned on while the transistors Q11 and Q4 are turned off. When the transistors Q12 and Q13 are turned on, the first signal Sin_1 is supplied through the node a2 to the primary coil L1 of the transformer 22, and the end of the primary coil L1 on the node a1 side is short-circuited to the ground line.

Figure 7:
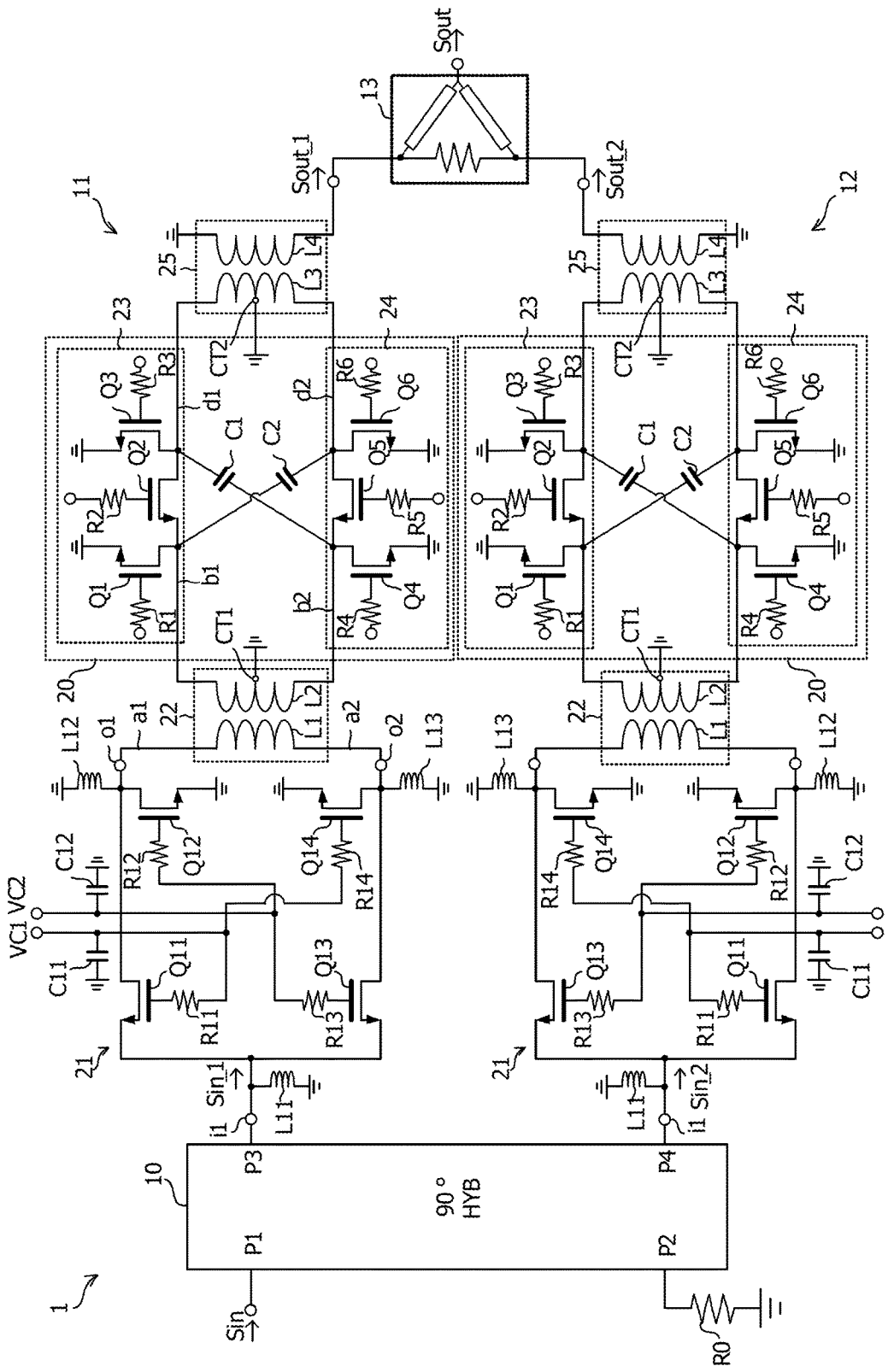
FIG. 7 illustrates an example of the phase shifter.

FIG. 7 illustrates an example of the phase shifter. The 0-π VATT 12 may include the configuration and function substantially same or similar to the 0-π VATT 11 described above. The output signal Sout_1 output from the 0-π VATT 11 and the output signal Sout_2 output from the 0-π VATT 12 are combined by the combining unit 13 in phase. The combining unit 13 may be a Wilkinson coupler, for example.

When the input signal Sin is input to the port P1, the 90-degree hybrid 10 outputs the first signal Sin_1 through the port P3 and outputs through the port P4, the second signal Sin_2 which is phase-shifted by 90 degrees with respect to the first signal Sin_1. The first signal Sin_1 is supplied to the 0-π VATT 11, and the second signal Sin_2 is supplied to the 0-π VATT 12. Hereinafter, the operation of the 0-π VATT 11 is described.

The transformer 22 converts the first signal Sin_1, which is a single-ended signal supplied through the switch unit 21, into a pair of differential signals having 180-degrees phase difference to each other and outputs the pair of differential signals to the nodes b1 and b2. The transformer 22 inverts the phases of the pair of differential signals output to the nodes b1 and b2 depending on the switching operation of the switch unit 21.

The switch unit 21 switches between a first state and a second state depending on the control voltages VC1 and VC2 externally supplied. In the first state, the pair of the transistors Q11 and Q14 are on. In the second state, the pair of the transistors Q12 and Q13 are on. By altering which pair of transistors to be on in the switch unit 21, the direction that the first signal Sin_1 is input to the primary coil L1 of the transformer 22 is changed, resulting in inversion of the phases of the pair of differential signals output from the secondary coil L2 of the transformer 22.

The first and second variable attenuation units 23 and 24 attenuate the amplitudes of the differential signals supplied to the nodes b1 and b2 by amounts of attenuation according to the control voltages VCG and VCS externally supplied. The amounts of attenuation in the first and second variable attenuation units 23 and 24 changes along with the change in the resistances of the transistors Q1 to Q6 functioning as variable resistors. The resistances of the transistors Q2 and Q5 are controlled with the control voltage VCG supplied to the gates thereof, and the resistances of the transistors Q1, Q3, Q4, and Q6 are controlled by the control voltage VCS supplied to the gates thereof. The amounts of attenuation of the first and second variable attenuation units 23 and 24 are controlled so that the output signal Sout from the phase shifter 1 has desired phase and amplitude.

The differential signals with the amplitudes adjusted by the first and second variable attenuation units 23 and 24 are converted to the signal-ended signal by the transformer 25, which is then output as the output signal Sout_1 of the 0-π VATT 11. The phase difference between the output signal Sout_1 and first signal Sin_1 is 0 or 180 degrees depending on the switching operation of the switch unit 21.

The 0-π VATT 12, similar to the 0-π VATT 11, outputs the output signal Sout_2 having a phase 0 or 180 degrees different from the phase of the second signal Sin_2 depending on the switching operation of the switch unit 21. The output signal Sout_2 is a signal having a phase 90 or 270 degrees different from the phase of the output signal Sout_1, for example.

The output signal Sout_1 from the 0-π VATT 11 and the output signal Sout_2 from the 0-π VATT 12 are subjected to vector composition by the combining unit 13. The resultant signal is output as the output signal Sout of the phase shifter 1. The 0-π VATTs 11 and 12 each include the function of switching the phase of the output signal Sout_1 and Sout_2 by 180 degrees and the function of changing the amplitude. In the output signal Sout, therefore, the phase is shifted 0 to 360 degrees while the amplitude is kept fixed.

Figure 8A:
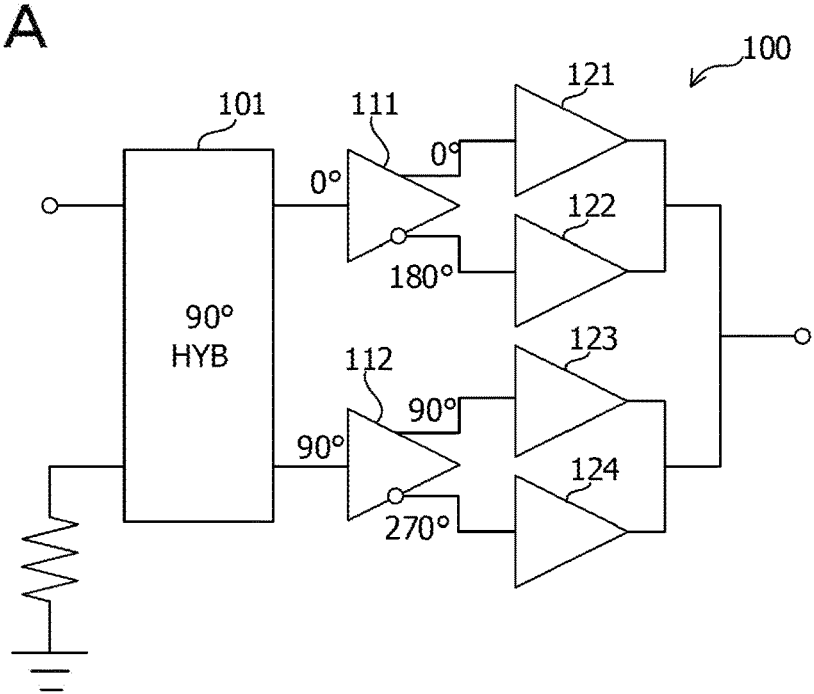
FIGS. 8A to 8C illustrate examples of the phase shifter.
Figure 8B:
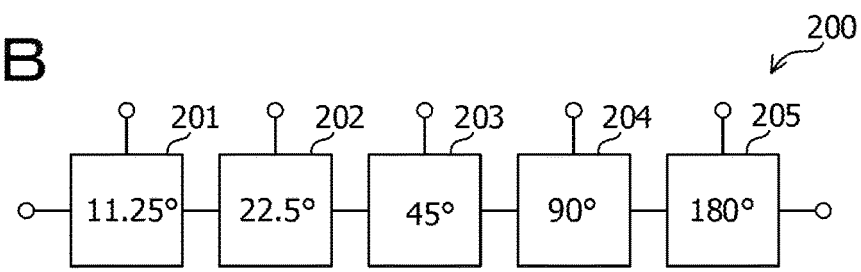
Figure 8C:
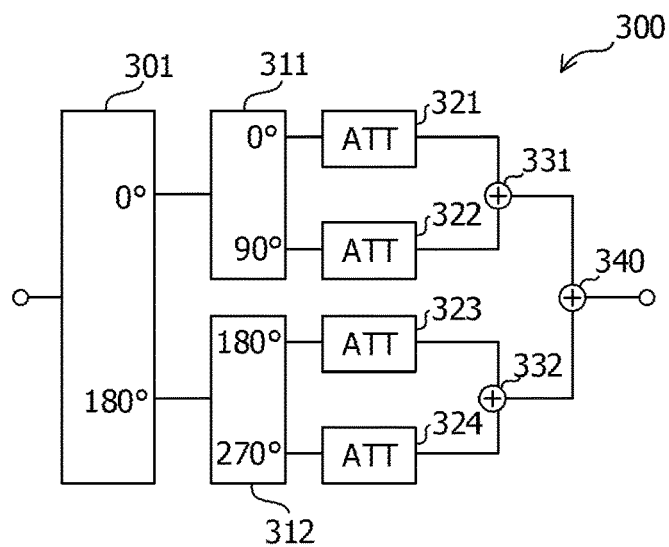

FIGS. 8A, 8B, and 8C illustrate examples of the phase shifter. A phase shifter 2 illustrated in FIG. 8A includes a 90-degree hybrid 100, signal conversion units 111 and 112, and variable gain amplifiers 121, 122, 123, and 124. The 90-degree hybrid 100 splits an input signal into two signals having identical amplitudes and a 90-degree phase difference. The signal conversion units 111 and 112 each converts the single-ended signal output from the 90-degree hybrid 100 into a pair of differential signals having a 180-degree phase difference. The signal conversion unit 111 outputs signals having phases 0 and 180 degrees different from the phase of the input signal, which are then supplied to the variable gain amplifiers 121 and 122, respectively. The signal conversion unit 112 outputs signals having phases 90 and 270 degrees different from the phase of the input signal, which are then supplied to the variable gain amplifiers 123 and 124, respectively. The variable gain amplifiers 121 to 124 individually amplify the input signals with an amplification factor according to the control voltage externally supplied and output the resultant signals. The phase shifter 2 illustrated in FIG. 8A performs vector composition for the signal obtained by vector composition for the output signals from the variable gain amplifiers 121 and 122 and the signal obtained by vector composition for the output signals from the variable gain amplifiers 123 and 124 and outputs the resultant signal.

The phase shifter 2 illustrated in FIG. 8A applies vector composition to two signals having a 90 or 270-degree phase difference to generate the output signal, so that the phase of the output signal is continuously shifted from 0 to 360 degrees. For example, since the four variable gain amplifiers 121 to 124 include active circuits that consume electric power, and the power consumption of the phase shifter 2 may be large. If a plurality of the phase shifters 2 illustrated in FIG. 8A are combined to constitute a phased array system, for example, the power consumption thereof may be larger.

A phase shifter 3 illustrated in FIG. 8B is configured to include plural phase shifter elements 201 to 205 which are connected in series. The phase shifter elements 201 to 205 give different shifts to input signals. Each of the phase shifter elements 201 to 205 includes a passive circuit composed of a resistor, a capacitor, an inductor, and the like, for example. The phase shifter 3 illustrated in FIG. 8B therefore does not request driving power, and the power consumption thereof may be substantially zero. In the phase shifter 3 illustrated in FIG. 8B, for example, the phase of the output signal is determined by selecting phase shifter elements to be enabled, from the plural phase shifter elements 201 to 205, so that the phase of the output signal may not continuously change. In order to increase the accuracy of the phase of the output signal, a phase shifter element which gives a smaller phase shift is added, for example. In the phase shifter 3 illustrated in FIG. 8B, addition of such a phase shifter element may increase the loss and reduce the power of the output signal. In the phase shifter 3 illustrated in FIG. 8B, the circuit impedance may be subject to change when the phase shifter elements to be enabled are changed. The phase shifter 3 illustrated in FIG. 8B risks variations in amplitude when the phase of the output signal is changed. The phase shifter 3 may have difficulty shifting the phase of the output signal while keeping the amplitude of the output signal fixed.

A phase shifter 4 illustrated in FIG. 8C includes a first distributor 300 which distributes an input signal into a signal phase-shifted by a 0-rad with respect to the input signal and a signal phase-shifted by a π-rad. The phase shifter 4 further includes second distributors 311 and 312 which distribute each of the 0 rad and π rad phase-shifted signals generated by the first distributor 300, into two signals phase-shifted by 0 rad and π/2 rad. The phase shifter 4 further includes four variable attenuators 321 to 324 which change the levels of the four signals generated by the second distributors 311 and 312. The phase shifter 4 includes former two-signal combiners 331 and 332 and a latter two-signal combiner 340 which combine the outputs from the four variable attenuators 321 to 324.

The phase shifter 4 illustrated in FIG. 8C uses a two-signal combiner of a two-stage structure including the former two-signal combiners 331 and 332 and latter two-signal combiner 340 as a member to combine the outputs from the four variable attenuators 321 to 324. For example, since the two-signal combiner of the phase shifter 4 has the two-stage structure, the phase shifter 4 may produce large combining loss and reduce the power of the output signal.

Figure 9A:
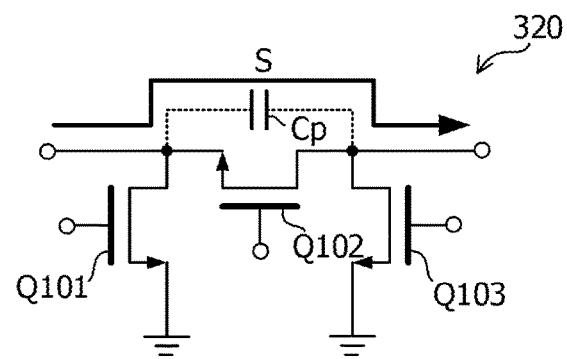
FIG. 9A illustrates an example of a π-type variable attenuator.
Figure 9B:
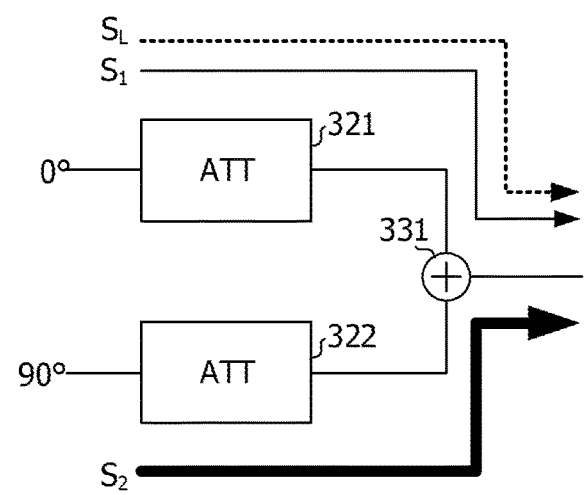
FIG. 9B illustrates an example of the flows of signals passing through the variable attenuator including a phase shifter.
Figure 9C:
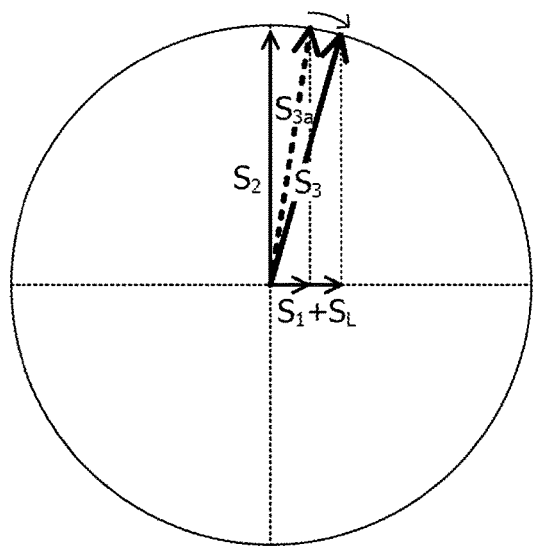
FIG. 9C illustrates an example of phase vectors of signals generated by vector composition of output signals from the variable attenuator of the phase shifter.

FIG. 9A illustrates an example of the π-type variable attenuator. FIG. 9B illustrates an example of the flow of the signal passing through the variable attenuator including a phase shifter. FIG. 9C illustrates an example of the phase vector of a signal generated by vector composition of output signals from variable attenuators of the phase shifter. When each of the variable attenuators 321 to 324 is composed of a π-type variable attenuator 320 including transistors Q101, Q102, and Q103, illustrated in FIG. 9A, for example, the following problem may occur. For example, in the π-type variable attenuator 320, a parasitic capacitor Cp is formed between input and output ends, and signal S input to the variable attenuator 320 is output via the parasitic capacitor Cp in some cases. Such signal leakage may make it difficult for the π-type variable attenuator 320 to provide a desired amount of attenuation. The higher the frequency of the signal S input to the variable attenuator 320, the more severe this problem may be.

FIG. 9B illustrates flow of signal passing through the π-type variable attenuators 321 and 322 included in the phase shifter 4 illustrated in FIG. 8C. FIG. 9C illustrates vectors indicating the phases of signals generated by vector composition for the output signals output from the variable attenuators 321 and 322. In FIG. 9B, the amount of attenuation of the variable attenuator 321 is set to a comparatively large value while the amount of attenuation of the variable attenuator 322 is set to a comparatively small value. To output signal $S_1$ output from the variable attenuator 321, leakage signal $S_L$ which leaks to the output end through the parasitic capacitor involved in the variable attenuator 321 is added. The leakage signal $S_L$ is a significant level compared to the output signal $S_1$ output from the variable attenuator 321 with an amount of attenuation set to a comparatively large value. To the output signal $S_2$ output from the variable attenuator 322, leakage signal is added. However, the ratio of the leakage signal to the output signal $S_2$ is low and is a negligible level. The two-signal combiner 331 generates signal $S_3$ by vector composition of the output signal $S_2$ and the output signal $S_1$ with the leakage signal $S_L$ superimposed thereon as illustrate in FIG. 9C. The phase of the signal $S_3$ is deviated from the phase of ideal signal $S_{3a}$ not including a leakage signal component.

As described above, the π-type variable attenuator 320 illustrated in FIG. 9A may provide a low isolation performance for high-frequency signal and have difficulty implementing high attenuation. When the variable attenuator 320 illustrated in FIG. 9A is used as the variable attenuators 321 to 324 in the phase shifter 4 illustrated in FIG. 8C, the phase shifter 4 may have difficulty generating a signal having a specific phase, such as a phase near each axis in vector illustrated in FIG. 9C, for example, and may produce large phase error.

In the phase shifter 1, for example, each of the switch unit 21, transformers 22 and 25, and variable attenuation unit 20, which are included in the 0-π VATTs 11 and 12, is composed of a passive circuit not requesting driving power. The source-drain voltages of the transistors Q11 to Q14 included in the switch unit 21 and the transistors Q1 to Q6 included in the variable attenuation unit 20 are 0 V and do not consume electric power, for example. The power consumption in the phase shifter 1 illustrated in FIG. 1 may be smaller than that in the phase shifter 2 illustrated in FIG. 2B.

The phase shifter 1 illustrated in FIG. 1 has a symmetric circuit configuration. The circuit impedance may not change even if the phases of the output signals Sout_1 and Sout_2 are switched by 180 degrees in the 0-π VATT 11 and 12. The amplitude of the output signal Sout from the phase shifter 1 is easily controlled.

In the phase shifter 1 illustrated in FIG. 1, the 0-π VATTs 11 and 12 each include the function of changing the amplitude of the output signal and the function of inverting the phase of the output signal. The circuit configuration may be therefore composed of two systems including: a system to process the first signal Sin_1; and a system to process the second signal Sin_2, and the phase shifter 1 includes only one element to combine the signals. Accordingly, the combining loss of the phase shifter 1 illustrated in FIG. 1 may be a half the combining loss of the phase shifter 4 according to the third comparative example requesting the two-signal combiner of the two-stage configuration.

The phase shifter 1 illustrated in FIG. 1 may be subject to such a signal leakage that the signal input to the first variable attenuation unit 23 leaks to the output end of the first variable attenuation unit 23 through the parasitic capacitor formed between the input end (node b1) and the output end (node d1) of the first variable attenuation unit 23. Similarly, the phase shifter 1 may be subject to such a signal leakage that the signal input to the second variable attenuation unit 24 leaks to the output end of the second variable attenuation unit 24 through the parasitic capacitor formed between the input end (node b2) and the output end (node d2) of the second variable attenuation unit 24.

According to the phase shifter 1 illustrated in FIG. 1, for example, the signal input to the input end of the second variable attenuation unit 24 is distributed to the output end of the first variable attenuation unit 23 through the capacitor C1 included in the first signal distribution unit 31. The signal (hereinafter, referred to as a first distributed signal) distributed by the first signal distribution unit 31 is a signal with a phase opposite to that of the leakage signal (hereinafter, referred to as a first leakage signal) leaking to the output end of the first variable attenuation unit 23. The first leakage signal is therefore cancelled by the first distributed signal. By setting the capacitance of the capacitor C1 equal to the capacitance of the parasitic capacitor formed between the input and output ends of the first variable attenuation unit 23, the amplitude of the first distributed signal may be equal to the amplitude of the first leakage signal, so that the first leakage signal may be cancelled substantially completely. In this case, the first signal distribution unit 31 supplies the first distributed signal having an amplitude corresponding to the amplitude of a signal which is output from the first variable attenuation unit 23 when the amount of attenuation of the first variable attenuation unit 23 is maximized, to the output end (node d1) of the first variable attenuation unit 23. For example, the first signal distribution unit 31 attenuates the signal input to the input end (node b2) of the second variable attenuation unit 24, by the amount of attenuation corresponding to the maximum amount of attenuation in the first variable attenuation unit 23 and supplies the resultant signal to the output end (node d1) of the first variable attenuation unit 23.

In a similar manner, the signal input to the input end of the first variable attenuation unit 23 is distributed to the output end of the second variable attenuation unit 24 by the capacitor C2 included in the second signal distribution unit 32. The signal (hereinafter, referred to as a second distributed signal) distributed by the second signal distribution unit 32 is a signal with a phase opposite to that of the leakage signal (hereinafter, referred to as a second leakage signal) leaking to the output end of the second variable attenuation unit 24. The second leakage signal is therefore cancelled by the second distributed signal. By setting the capacitance of the capacitor C2 equal to the capacitance of the parasitic capacitor formed between the input and output ends of the second variable attenuation unit 24, the amplitude of the second distributed signal may be equal to the amplitude of the second leakage signal, so that the second leakage signal may be reduced. In this case, the second signal distribution unit 32 supplies the second distributed signal having an amplitude corresponding to the amplitude of a signal which is output from the second variable attenuation unit 24 when the amount of attenuation of the second variable attenuation unit 24 is maximized, to the output end (node d1) of the second variable attenuation unit 24. For example, the second signal distribution unit 32 attenuates the signal input to the input end (node b1) of the first variable attenuation unit 23, by the amount of attenuation corresponding to the maximum amount of attenuation in the second variable attenuation unit 24 and supplies the resultant signal to the output end (node d2) of the second variable attenuation unit 24.

As described above, according to the aforementioned phase shifter 1, the first and second signal distribution units 31 and 32 may improve the isolation performance of the first and second variable attenuation units 23 and 24 and implement high attenuation, thus reducing the phase error of the output signal Sout from the phase shifter 1.

Figure 10:
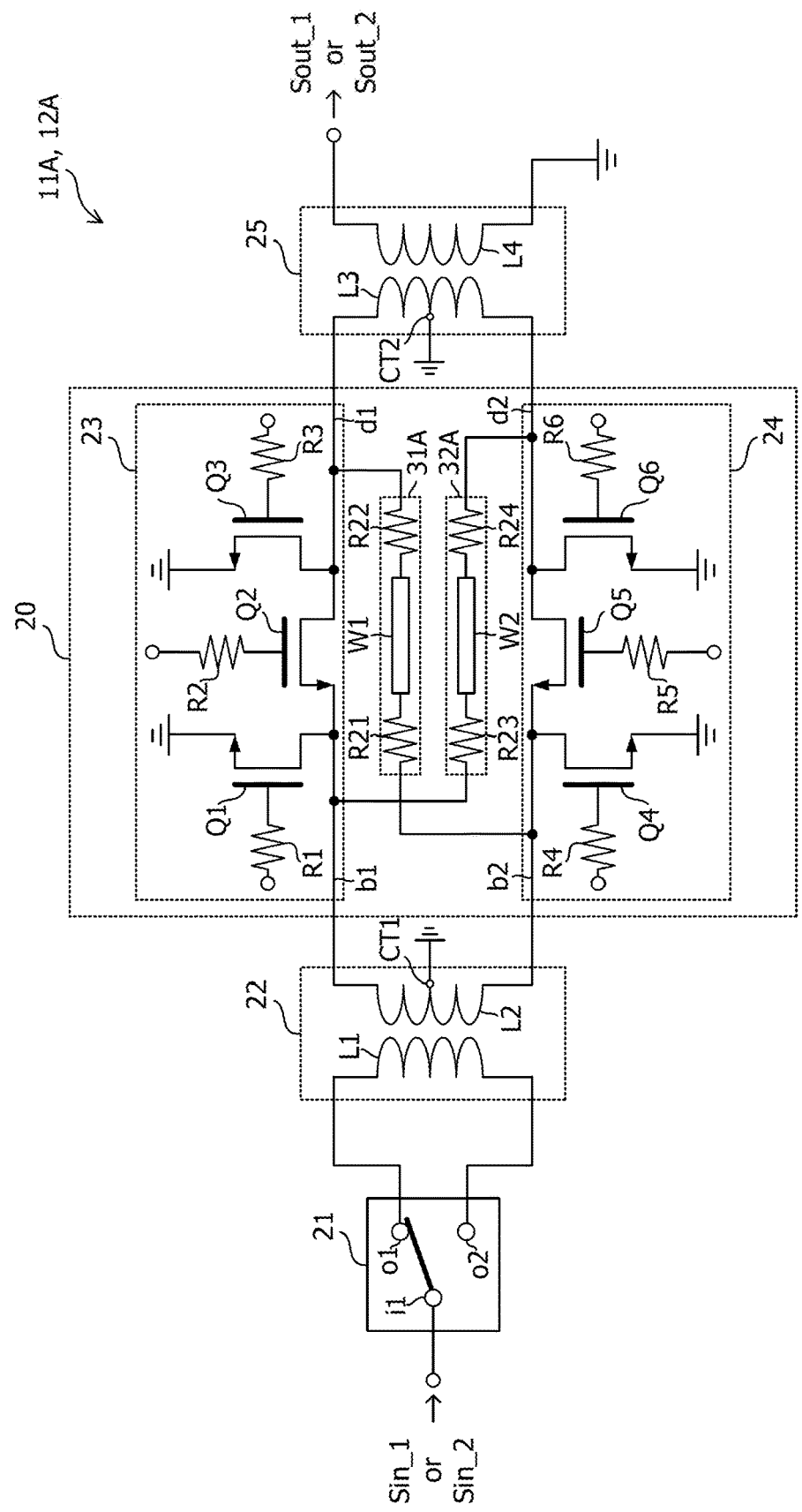
FIG. 10 illustrates an example of the phase-switching variable attenuation device.

FIG. 10 illustrates an example of a phase-switching variable attenuation device. FIG. 10 illustrates the configuration of 0-π VATTs 11A and 12A. The 0-π VATTs 11A and 12A are different from the 0-π VATTs 11 and 12 illustrated in FIG. 4 in the configurations of the first and second signal distribution units 31A and 32A. In the 0-π VATTs 11A and 12A, each of the first and second signal distribution units 31A and 32A includes an attenuator and a delay unit.

The first signal distribution unit 31A includes resistive elements R21 and R22 functioning as the attenuator and a delay line W1 functioning as the delay unit. An end of the resistive element R21 is connected to the input end (node b2) of the second variable attenuation unit 24 while the other end is connected to an end of the delay line W1. An end of the resistive element R22 is connected to the output end (node d1) of the first variable attenuation unit 23 while the other end is connected to the other end of the delay line W1. Since the delay line W1 is provided between the resistive elements R21 and R22, the first signal distribution unit 31A has a symmetric layout.

In a similar manner, the second signal distribution unit 32A includes resistive elements R23 and R24 functioning as the attenuator and a delay line W2 functioning as the delay unit. An end of the resistive element R23 is connected to the input end (node b1) of the first variable attenuation unit 23 while the other end is connected to an end of the delay line W2. An end of the resistive element R24 is connected to the output end (node d2) of the second variable attenuation unit 24 while the other end is connected to the other end of the delay line W2. Since the delay line W2 is provided between the resistive elements R23 and R24, the second signal distribution unit 32A has a symmetric layout.

As described above, the first and second signal distribution units 31A and 32A may exert the same function as the first and second signal distribution units 31 and 32, which include capacitors and are illustrated in FIG. 4. For example, leakage signal leaking to the output end of the first variable attenuation unit 23 may be cancelled by the signal supplied by the first signal distribution unit 31A. Leakage signal leaking to the output end of the second variable attenuation unit 24 may be cancelled by the signal supplied by the second signal distribution unit 32A.

Figure 11:
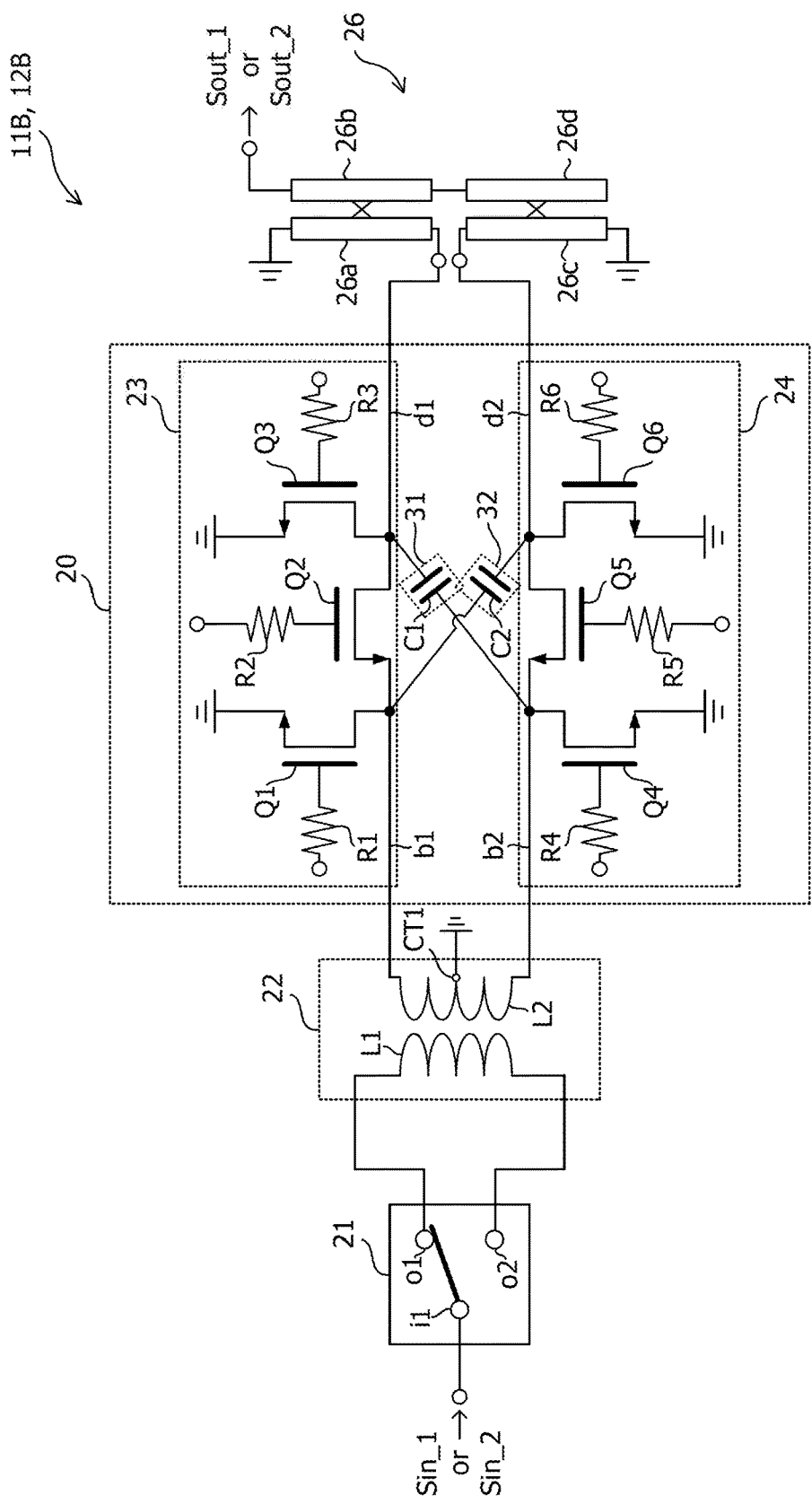
FIG. 11 illustrates another example of the phase-switching variable attenuation device.

FIG. 11 illustrates an example of the phase-switching variable attenuation device. The 0-π VATTs 11 and 12 illustrated in FIG. 4 use the transformer 25 as a member to convert differential signals to a single-ended signal. 0-π VATTs 11B and 12B illustrated in FIG. 11 use a Marchand balun 26 as a member to convert differential signals to a single-ended signal. The Marchand balun 26 includes a coupled line composed of lines 26a and 26b and a coupled line composed of lines 26c and 26d. Each of the lines 26a to 26d has a length corresponding to ¼ of the signal wavelength. An end of the line 26a is connected to the ground line while the other end is connected to the node d1. An end of the line 26c is connected to the ground line while the other end is connected to the node d2. An end of the line 26b is connected to the output end of the 0-π VATT 11B or 12B while the other end is connected to an end of the line 26d. The other end of the line 26d is opened. The 0-π VATTs 11B and 12B using the Marchand balun 26 as the member to convert differential signals to a single-ended signal as described above may exert the same function as the 0-π VATTs 11 and 12 illustrated in FIG. 4.

Figure 12:
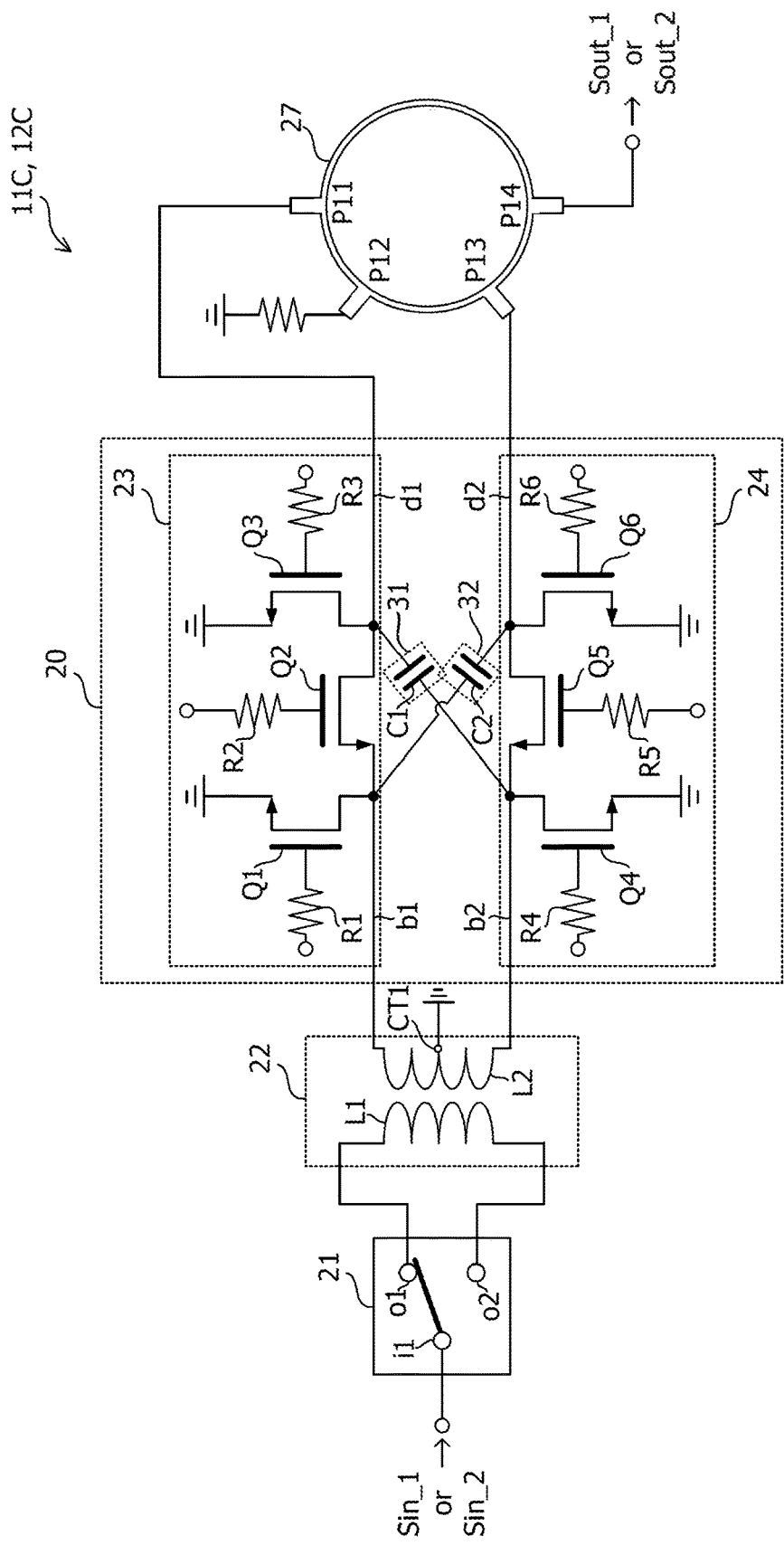
FIG. 12 illustrates still another example of the phase-switching variable attenuation device.

FIG. 12 illustrates an example of the phase-switching variable attenuation device. The 0-π VATTs 11 and 12 illustrated in FIG. 4 use the transformer 25 as the member to convert differential signals to a single-ended signal. 0-π VATTs 11C and 12C illustrated in FIG. 12 use a rat-race hybrid 27 as the member to convert differential signals to a single-ended signal. The rat-race hybrid 27 includes a circuit composed of three ¼ wavelength transmission lines and one ¾ wavelength transmission line connected to each other in a ring form, and in-phase distribution or reverse phase distribution of an input signal is performed by selection of the input terminal. In the rat-race hybrid 27, a port P11 is connected to the node d1, and a port P12 is connected to the ground line through the resistive element. A port P13 is connected to the node d2, and a port P14 is connected to the output end of the 0-π VATT 11C or 12C. The 0-π VATTs 11C and 12C, which use the rat-race hybrid 27 as the member to convert differential signals to a single-ended signal as described above, may exert the same function as the 0-π VATTs 11 and 12 illustrated in FIG. 4.

Figure 13:
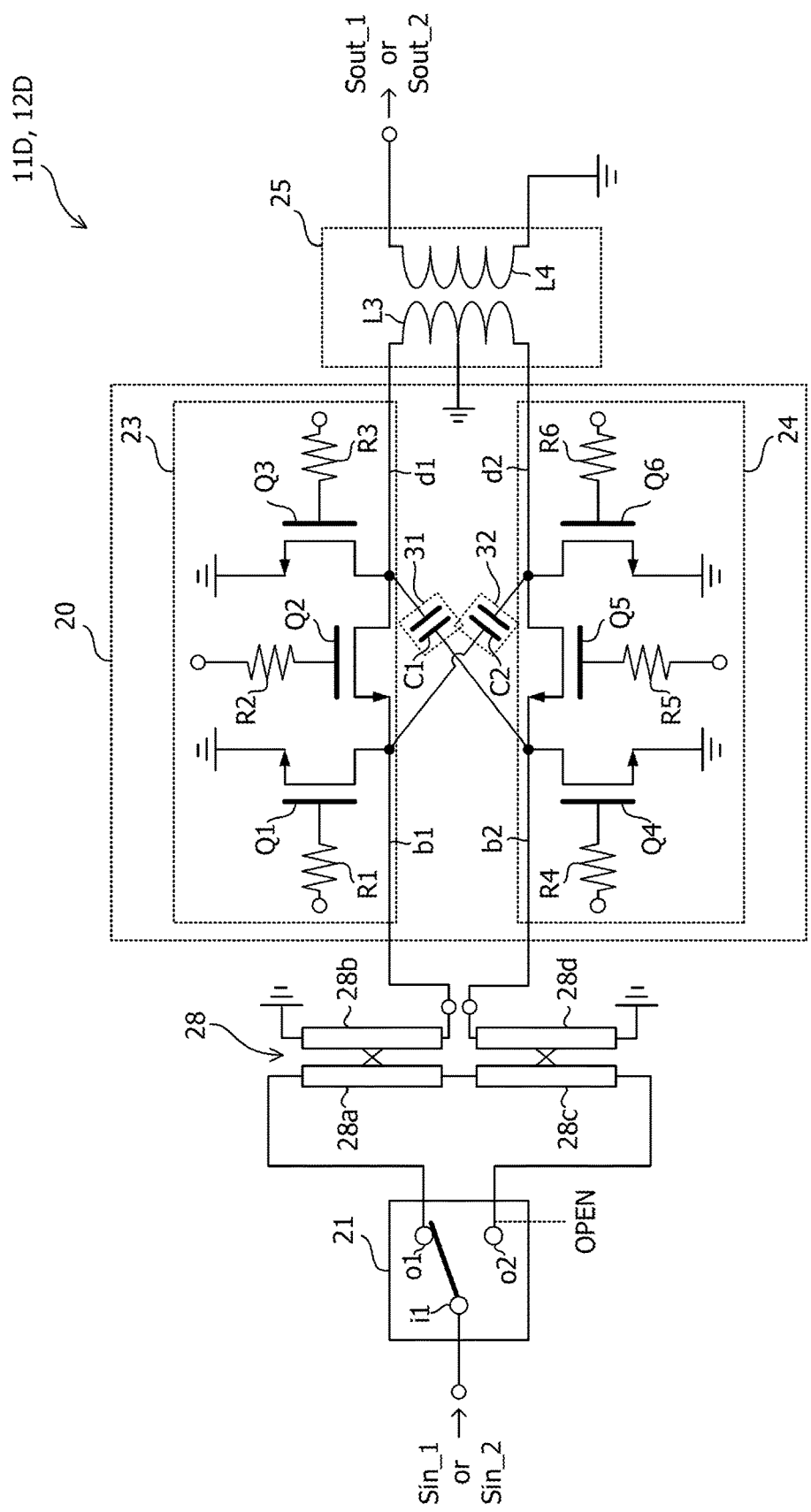
FIG. 13 illustrates still another example of the phase-switching variable attenuation device.

FIG. 13 illustrates an example of the phase-switching variable attenuation device. The 0-π VATTs 11 and 12 illustrated in FIG. 4 use the transformer 22 as a member to convert a single-ended signal to differential signals. 0-π VATTs 11D and 12D illustrated in FIG. 13 use a Marchand balun 28 as the member to convert a single-ended signal to differential signals.

The Marchand balun 28 includes a coupled line composed of lines 28a and 28b and a coupled line composed of lines 28c and 28d. Each of the lines 28a to 28d has a length corresponding to ¼ of the signal wavelength. An end of the line 28a is connected to the output end o1 of the switch unit 21 while the other end is connected to an end of the line 28c. The other end of the line 28c is connected to the output end o2 of the switch unit 21. An end of the line 28b is connected to the ground line while the other end is connected to the node b1. An end of the line 28d is connected to the ground line while the other end is connected to the node b2. When the Marchand balun 28 is used as the member to convert a single-ended signal to differential signals, the switch unit 21 may be configured as follows. When the output end o1 is selected in the switch unit 21, for example, the output end o2 is opened. When the output end o2 is selected in the switch unit 21, the output end o1 is opened. The 0-π VATTs 11D and 12D using the Marchand balun 28 as the member to convert a single-ended signal to differential signals as described above may exert the same function as the 0-π VATTs 11 and 12 illustrated in FIG. 4.

The configurations of the 0-π VATTs 11, 11A to 11D, 12, and 12A to 12D, which are illustrated in FIGS. 4 and 10 to 13, may be properly combined.

The variable attenuation unit 20 may be an example of a variable attenuation device and a variable attenuation unit. The first variable attenuation unit 23 may be an example of a first variable attenuation unit. The second variable attenuation unit 24 may be an example of a second variable attenuation unit. The first signal distribution unit 31 is an example of a first signal distribution unit. The second signal distribution unit 32 is an example of the second signal distribution unit. The transistors Q1 to Q3 and Q4 to Q6 are an example of variable resistors in the disclosed technique. The capacitor C1 may be an example of a first capacitor. The capacitor C2 may be an example of a second capacitor. The 0-π VATTs 11, 11A to 11D, 12, and 12A to 12D may be an example of a phase-switching variable attenuation device. The switch unit 21 may be an example of a switch unit. The transformer 22 and Marchand balun 28 may be an example of the first conversion unit. The transformer 25, Marchand balun 26, and rat-race hybrid 27 may be an example of a second conversion unit. The phase shifter 1 may be an example of a phase shifter. The 90-degree hybrid 10 may be an example of a signal distribution unit. The combining unit 13 may be an example of a combining unit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A variable attenuation device comprising:
    a converter including two input ends with each other and output ends which output a pair of differential signals having a 180-degree phase difference based on a first signal through one of the input ends and a second signal through the other of the input ends; and
    an variable attenuator configured to attenuate the pair of differential signals at the output ends according to an amount of attenuation corresponding to a control voltage,
    wherein the variable attenuator includes:
        a first variable attenuator configured to receive, as the first signal, one of the pair of differential signals at a first input end, attenuate the first signal according to the amount of attenuation and output a first attenuated signal from a first output end; and
        a second variable attenuator configured to receive, as the second signal, the other one of the pair of differential signals at a second input end, attenuate the second signal according to the amount of attenuation and output a second attenuated signal from a second output end,
    wherein the converter includes:
        a primary coil coupled between one of the two input ends and the other of the two input ends; and
        a secondary coil between the first input end and the second input end,
    wherein the variable attenuation device further includes:
    a first signal distributer configured to distribute the second signal to the first output end; and
    a second signal distributer configured to distribute the first signal to the second output end.

2. The variable attenuation device according to claim 1, wherein each of the first and second variable attenuators includes a plurality of variable resistors.

3. The variable attenuation device according to claim 2, wherein
    the first signal distributer outputs a signal having an amplitude corresponding to an amplitude of a first leakage signal which leaks from the first input end to the first output end through a parasitic capacitor formed between the first input and output ends, and
    the second signal distributer outputs a signal having an amplitude corresponding to an amplitude of a second leakage signal which leaks from the second input end to the second output end through a parasitic capacitor formed between the second input and output ends.

4. The variable attenuation device according to claim 3, wherein
    the first signal distributer distributes, to the first output end, a signal having an amplitude corresponding to an amplitude of the attenuated first signal when the amount of attenuation of the first variable attenuator is maximized, and
    the second signal distributer distributes, to the second output end, a signal having an amplitude corresponding to an amplitude of the attenuated second signal when the amount of attenuation of the second variable attenuator is maximized.

5. The variable attenuation device according to claim 1, wherein
    the first signal distributer includes a first capacitor with one end coupled to the second input end and the other end coupled to the first output end, and
    the second signal distributer includes a second capacitor with one end coupled to the first input end and the other end coupled to the second output end.

6. The variable attenuation device according to claim 1, wherein
    the first signal distributer includes a resistive element provided between the second input end and the first output end, and
    the second signal distributer includes a resistive element provided between the first input end and the second output end.

7. A phase-switching variable attenuation device, comprising:
    a switch including an input end and two output ends and configured to switch an output destination of a first single-ended signal input to the input end;
    a first converter coupled to each of the two output ends of the switch and configured to convert the first single-ended signal to a pair of differential signals having a 180-degree phase difference and invert the phases of the pair of differential signals according to a switching operation of the switch;
    a variable attenuator configured to attenuate the pair of differential signals by an amount of attenuation according to a control voltage and output the attenuated pair of differential signals; and
    a second converter configured to convert the attenuated pair of differential signals to a second single-ended signal,
    wherein the variable attenuator includes:
        a first variable attenuator configured to receive a first signal through a first input end, attenuate the first signal by an amount of attenuation according to a control voltage, and output the attenuated first signal through a first output end, the first signal being one of the pair of differential signals;
        a second variable attenuator configured to receive a second signal through a second input end, attenuate the second signal by the amount of attenuation according to the control voltage, and output the attenuated second signal through a second output end, the second signal being the other one of the pair of differential signals; a first signal distributer configured to distribute the second signal to the first output end; and
        a second signal distributer configured to distribute the first signal to the second output end.

8. The phase-switching variable attenuation device according to claim 7, wherein the first converter includes a first transformer including:
- a primary coil with ends coupled to the respective two output ends of the switch; and
- a secondary coil with one end coupled to the first input end and the other end coupled to the second input end.

9. The phase-switching variable attenuation device according to claim 8, wherein an input direction, to the primary coil, of the signal-ended signal from the switch to the first transformer is switched according to the switching operation of the switch.

10. The phase-switching variable attenuation device according to claim 8, wherein the switch short-circuits one of the two output ends that is not coupled to the single input end to a specific potential.

11. The phase-switching variable attenuation device according to claim 8, wherein the secondary coil of the first transformer includes a center tap fixed to a specific potential.

12. The phase-switching variable attenuation device according to claim 7, wherein the second converter includes a second transformer including:
- a primary coil with one end coupled to the first output end and the other end coupled to the second output end; and
- a secondary coil configured to output the second single-ended signal which is obtained by converting the pair of differential signals.

13. The phase-switching variable attenuation device according to claim 12, wherein the primary coil of the second transformer includes a center tap fixed to a specific potential.

14. A phase shifter, comprising:
- a signal distributer configured to output two first single-ended signals having a 90-degree phase difference from different output ends;
- two phase-switching variable attenuation devices coupled to the respective output ends of the signal distributer; and
- a combining device configured to combine signals output from the two phase-switching variable attenuation devices,
- wherein each of the two phase-switching variable attenuation devices includes:
  - a switch including an input end and two output ends and configured to switch an output destination of the first single-ended signal input to the input end;
  - a first converter coupled to each of the two output ends of the switch and configured to convert the first single-ended signal to a pair of differential signals having a 180-degree phase difference and invert the phases of the pair of differential signals according to a switching operation of the switch;
  - a variable attenuator configured to attenuate the pair of differential signals by an amount of attenuation according to a control voltage and output the attenuated pair of differential signals; and
  - a second converter configured to convert the attenuated pair of differential signals to a second single-ended signal,
- wherein the variable attenuator includes:
  - a first variable attenuator configured to receive a first signal through a first input end, attenuate the first signal by an amount of attenuation according to a control voltage, and output the attenuated first signal through a first output end, the first signal being one of the pair of differential signals;
  - a second variable attenuator configured to receive a second signal through a second input end, attenuate the second signal by the amount of attenuation according to the control voltage, and output the attenuated second signal through a second output end, the second signal being the other one of the pair of differential signals;
  - a first signal distributer configured to distribute the second signal to the first output end; and
  - a second signal distributer configured to distribute the first signal to the second output end.

15. The phase shifter according to claim 14, wherein
the first converter includes a Marchand balun including a first coupled line composed of first and second lines and a second coupled line composed of third and fourth lines,
one end of the first line is coupled to one of the output ends of the switch, the other end of the first line is coupled to one end of the third line, the other end of the third line is coupled to the other output end of the switch, an end of the second line is coupled to a ground line, the other end of the second line is coupled to the first input end, an end of the fourth line is coupled to the ground line, and the other end of the fourth line is coupled to the second input end.

16. The phase shifter according to claim 15, wherein the switch open-circuits one of the two output ends that is not coupled to the single input end.

17. The phase shifter according to claim 14, wherein the switch includes:
- a first transistor provided between the input end and one of the two output ends;
- a second transistor provided between the one of the two output ends and the ground line;
- a third transistor provided between the single input end and the other one of the two output ends; and
- a fourth transistor provided between the other one of the two output ends and the ground line.

18. The phase shifter according to claim 14, wherein
the first signal distributer outputs a signal having an amplitude corresponding to an amplitude of a first leakage signal which leaks from the first input end to the first output end through a parasitic capacitor formed between the first input and output ends, and
the second signal distributer outputs a signal having an amplitude corresponding to an amplitude of a second leakage signal which leaks from the second input end to the second output end through a parasitic capacitor formed between the second input and output ends.

19. The phase shifter according to claim 18, wherein
the first signal distributer distributes, to the first output end, a signal having an amplitude corresponding to an amplitude of the attenuated first signal when the amount of attenuation of the first variable attenuator is maximized, and
the second signal distributer distributes, to the second output end, a signal having an amplitude corresponding to an amplitude of the attenuated second signal when the amount of attenuation of the second variable attenuator is maximized.

20. The phase shifter according to claim 14, wherein
the first signal distributer includes a first capacitor with one end coupled to the second input end and the other end coupled to the first output end, and
the second signal distributer includes a second capacitor with one end coupled to the first input end and the other end coupled to the second output end.

21. The phase shifter according to claim 14, wherein
the first converter includes a first transformer including:
- a primary coil with ends coupled to the respective two output ends of the switch; and
- a secondary coil with one end coupled to the first input end and the other end coupled to the second input end.

22. The phase shifter according to claim 21, wherein an input direction, to the primary coil, of the signal-ended signal from the switch to the first transformer is switched according to the switching operation of the switch.

23. The phase shifter according to claim 21, wherein the switch short-circuits one of the two output ends that is not coupled to the single input end to a specific potential.

24. The phase shifter according to claim 21, wherein the secondary coil of the first transformer includes a center tap fixed to a specific potential.

25. The phase shifter according to claim 14, wherein
the second converter includes a second transformer including:
- a primary coil with one end coupled to the first output end and the other end coupled to the second output end; and
- a secondary coil configured to output the second single-ended signal which is obtained by converting the pair of differential signals.

26. The phase shifter according to claim 25, wherein the primary coil of the second transformer includes a center tap fixed to a specific potential.

* * * * *